(12) United States Patent
Furihata et al.

(10) Patent No.: US 6,461,939 B1
(45) Date of Patent: Oct. 8, 2002

(54) SOI WAFERS AND METHODS FOR PRODUCING SOI WAFER

(75) Inventors: Jun-ichiro Furihata; Kiyoshi Mitani; Norihiro Kobayashi; Shoji Akiyama, all of Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/701,280
(22) PCT Filed: Mar. 31, 2000
(86) PCT No.: PCT/JP00/02074
§ 371 (c)(1), (2), (4) Date: Nov. 28, 2000
(87) PCT Pub. No.: WO00/62343
PCT Pub. Date: Oct. 19, 2000

(30) Foreign Application Priority Data

Apr. 9, 1999 (JP) .............................. 11-102698

(51) Int. Cl.[7] .............................................. H01L 21/46
(52) U.S. Cl. .................... 438/459; 438/458; 438/455
(58) Field of Search ............................. 438/459, 455, 438/458, 151, 526, 409, 404, 149, 430, 407, 423, 766; 257/131, 156, 578; 437/62, 249, 974

(56) References Cited

U.S. PATENT DOCUMENTS 5,650,353 A * 7/1997 Yoshizawa et al.
6,191,007 B1 * 2/2001 Matsui et al. .............. 438/459
6,245,311 B1 * 6/2001 Kobayashi et al. ......... 423/348

FOREIGN PATENT DOCUMENTS

| DE | 197 53 494 A1 | 1/1998 |
|---|---|---|
| EP | 0 553 852 A2 | 8/1993 |
| EP | 0 553 852 A3 | 1/1998 |
| EP | 0 926 719 A2 | 6/1999 |

(List continued on next page.)

OTHER PUBLICATIONS

Moriceau H. et al., "Hydrogen Annealing Treatment used to Obtain High Quality SOI Surfaces", 1998 IEEE International SIO Conference Proceedings. Stuart, FL, Oct. 5–8, 1998, Annual IEEE International Silicon–on–insulator conference, New York, NY: IEEE, US, vol. CONF. 24, Oct. 5, 1998, pp. 37–38.

Nobuhiko Sato et al., "Hydrogen annealed silicon–on–insulator", Applied Physics Letters, vol. 65, No. 15, Oct. 10, 1994, pp. 1924–1926.

Primary Examiner—Caridad Everhart
Assistant Examiner—V. Yevsikov
(74) Attorney, Agent, or Firm—Oliff & Berridge, PLC

(57) ABSTRACT

According to the present invention, there are provided an SO wafer wherein surface roughness of an SOI layer surface of the SOI wafer is 0.12 nm or less in terms of RMS value and/or interface roughness of an interface between the SOT layer and a buried oxide layer of the SOI wafer is 0.12 nm or less in terms of RMS value, and a method for producing an SOI wafer, which comprises mirror-polishing an SOI wafer, removing a native oxide film on a surface of the wafer or forming a thermal oxide film having a thickness of 300 nm or more on the surface and removing the thermal oxide film, and subjecting the wafer to a heat treatment in an atmosphere of 100% hydrogen or a mixed gas atmosphere of argon and/or nitrogen containing 10% or more of hydrogen by using a rapid heating and rapid cooling apparatus. Thus, there can be obtained an SOI wafer of high quality having surface roughness of the SOI layer surface and interface roughness of the SOI/BOX interface that affect extremely little on the fluctuation of device characteristics of MOS devices fabricated by using the SOI wafer, such as dielectric breakdown voltage, threshold voltage and carrier mobility, and a method for producing the same.

17 Claims, 3 Drawing Sheets

FOREIGN PATENT DOCUMENTS

| | | |
|---|---|---|
| EP | 0 926 719 A3 | 7/1999 |
| EP | 0 955 671 A1 | 11/1999 |
| JP | A-3-46227 | 2/1991 |
| JP | A 3-109731 | 5/1991 |
| JP | A-3-181115 | 8/1991 |
| JP | A-4-79209 | 3/1992 |
| JP | B2-5-46086 | 7/1993 |
| JP | A-5-205987 | 8/1993 |
| JP | A-5-211128 | 8/1993 |
| JP | A-5-217821 | 8/1993 |
| JP | A-7-50234 | 2/1995 |
| JP | A-7-183477 | 7/1995 |
| JP | A-7-220987 | 8/1995 |
| JP | A-7-263538 | 10/1995 |
| JP | A-7-283382 | 10/1995 |
| JP | A-8-330198 | 12/1996 |
| JP | A-10-84101 | 3/1998 |
| JP | A 10-275905 | 10/1998 |
| JP | A-2000-114501 | 4/2000 |

* cited by examiner

SOI WAFERS AND METHODS FOR PRODUCING SOI WAFER

TECHNICAL FIELD

The present invention relates to SOI wafers wherein a silicon oxide film insulator layer is formed in a silicon single crystal wafer, and methods for producing an SOI wafer.

BACKGROUND ART

The so-called SOI (Silicon On Insulator) structure, which comprises an active silicon layer on an electrically insulating silicon oxide film, can provide excellent processing velocity of devices, low power consumption, high breakdown voltage, environmental friendliness etc., and therefore attracts much attention in recent years. As typical production methods of SOI wafers having such an SOI structure, there are the SIMOX (Separation by Implanted Oxygen) method, and the bonding method.

The SIMOX method is a technique that comprises implanting oxygen ions ($^{16}O^+$) of a high concentration from a surface of a silicon wafer to form a high concentration oxygen ion implanted layer at a predetermined depth in the wafer, and annealing the wafer at a high temperature of, for example, 1100–1300° C. for several hours to convert the high concentration ion implanted layer into $SiO_2$ that serves as a buried oxide layer (it is also referred to as "BOX" hereafter) of an SOI wafer, and it has an advantage that a uniform SOI layer thickness can be obtained. However, it suffers from a problem that crystallinity of the SOI layer is degraded.

Further, the bonding method is a technique that comprises bonding two silicon wafers via a silicon oxide film. In this method, as described in, for example, Japanese Patent Publication (Kokoku) No. 5-46086, an oxide film is formed on at least one of the two wafers, the wafers are closely contacted with each other so as not to contain any foreign matters between the surfaces to be bonded and then they are subjected to a heat treatment at a temperature of 200–1200° C. to enhance the bonding strength. Because it enables subsequent grinding and polishing processes of the bonded wafers of which bonding strength is enhanced by the heat treatment, the wafer of the device fabrication side can be processed by grinding and polishing to reduce its thickness to a desired thickness, and thereby SOI layer on which devices are fabricated can be formed.

A bonded SOI wafer produced as described above has advantages of excellent crystallinity of the SOI layer and high reliability of the produced buried oxide layer existing immediately below the SOI layer. However, because a thin film should be formed by grinding and polishing, the operation for producing the thin film takes time, and there are generated material loss. In addition, the uniformity of the film thickness obtained by this method is only in a level of the desired film thickness±about 0.3 $\mu$m. As a method for making a thin film that solves such problems of the bonding method as for uniformity of film thickness, there has been developed a method called hydrogen ion delamination method as disclosed in Japanese Patent Laid-open (Kokai) No. 5-211128.

This hydrogen ion delamination method is a technique that comprises forming an oxide film on at least one of two silicon wafers, implanting at least one of hydrogen ions or rare gas ions into one of the silicon wafers from its upper surface to form a fine bubble layer (enclosed layer) inside the silicon wafer, bringing the ion-implanted surface into contact with the other wafer via the oxide film, then subjecting the wafers to a heat treatment (delaminating heat treatment) to delaminate one of the wafer as a thin film at the fine bubble layer as a cleavage plane (delaminating plane), and further subjecting them to a heat treatment (bonding heat treatment) for firmly bonding them to obtain an SOI wafer. The surface (delaminated surface) of the SOI wafer produced as described above becomes a relatively good mirror surface. However, in order to obtain an SOI wafer having a surface roughness comparable to an ordinary mirror-polished wafer, it is necessary to perform polishing with extremely little stock removal for polishing, called touch polish.

By this method, an SOI wafer having extremely high uniformity of the SOI layer is relatively easily obtained, and in addition, it has an advantage that the material can be used effectively, because the delaminated one of the wafers can be recycled.

Further, this method also enables silicon wafers to directly bond together without an intermediate oxide layer, and it can be used not only for bonding silicon wafers together, but also for bonding a silicon wafer to an insulating wafer such as quartz, silicon carbide, alumina or the like having a different coefficient of thermal expansion by implanting ions into the silicon wafer.

By the way, in addition to the problem concerning the crystallinity of the SOI layer, the wafer produced by the aforementioned SIMOX method suffers from a problem that the interface between the SOI layer and BOX (it may be also referred to as "SOI/BOX interface" hereinafter) would have serious unevenness, and hence characteristics of the fabricated devices may be likely to fluctuate. As a method for solving this problem, Japanese Patent Laid-open (Kokai) No. 7-263538 discloses a method that can reduce an RMS value (Root Mean Square Value: square average and square root roughness), which represents roughness of interface, of about 2 nm to a level of about 0.85 nm.

As for an SOI wafer produced by the bonding method, however, the interface roughness of the SOI/BOX interface has not caused a problem. That is, because the bonded SOI wafer is obtained by bonding two of mirror-polished silicon wafers via an oxide film as described above, the interface roughness of the SOI/BOX interface depends on the surface roughness of the silicon wafers used. The level of surface roughness of silicon wafers currently used for the production of bonded SOI wafers is about 0.15 nm in terms of RMS, and thus the SOI/BOX interface produced by using such wafers have an interface roughness at a level comparable to it. This is considerably excellent level compared with that provided by SIMOX, and hence the interface roughness of the SOI/BOX interface of an SOI wafer produced by the bonding method has not caused a problem.

However, the development of the techniques for making a thin film such as the aforementioned hydrogen ion delamination method drastically progressed the method for forming a thin film of an SOI wafer and improved thickness uniformity thereof, and thus it became well possible to obtain an SOI layer having an extremely small thickness, i.e., 100±10 nm. As a result, it was found that, even if the level of the surface roughness of the SOI layer surface or the interface roughness of the SOI/BOX interface is about 0.15 nm, which had not been conventionally considered a problem, the characteristics of MOS devices fabricated by using the SOI wafer, such as oxide dielectric breakdown voltage, threshold voltage and carrier mobility, might be adversely affected, i.e., they might be fluctuated, for example, if the thickness of the SOI layer became 500 nm or less. The major cause of this phenomenon is considered that the influence of the surface roughness of the SOI layer surface and the interface roughness of the SOI/BOX interface became significant for the film thickness, because the thickness of the SOI layer was made extremely small and the layer was used with uniform film thickness distribution.

DISCLOSURE OF THE INVENTION

Therefore, the present invention was accomplished in view of such problems, and its object is to provide an SOI wafer having surface roughness of the SOI layer surface and interface roughness of the SOI/BOX interface that affect extremely little on the fluctuation of device characteristics of MOS devices fabricated by using the SOI wafer, such as dielectric breakdown voltage, threshold voltage and carrier mobility, and a method for producing the same.

In order to achieve the aforementioned object, the present invention provides an SOI wafer wherein surface roughness of an SOI layer surface of the SOI wafer is 0.12 nm or less in terms of RMS value.

Since the level of such an excellent surface roughness of the SOI surface layer of the SOI wafer is more excellent compared with the level of the surface roughness of ordinary mirror-polished wafers, devices fabricated on the SOI layer surface can have extremely superior device characteristics such as dielectric breakdown voltage, threshold voltage and carrier mobility with little fluctuation thereof.

The present invention also provides an SOI wafer wherein interface roughness of an interface between an SOI layer and a buried oxide layer of the SOI wafer is 0.12 nm or less in terms of RMS value. Also in this case, good device characteristics with very little fluctuation can be obtained like the aforementioned SOI wafer.

The present invention further provides an SOI wafer wherein surface roughness of an SOI layer surface of the SOI wafer is 0.12 nm or less in terms of RMS value, and interface roughness of an interface between the SOI layer and a buried oxide layer of the SOI wafer is 0.12 nm or less in terms of RMS value.

Since the levels of such an excellent surface roughness of the SOI layer surface and interface roughness of the interface between an SOI layer and a buried oxide layer of the SOI wafer are more superior levels compared with the surface roughness and the interface roughness of ordinary SOI wafers, these surface roughness levels more effectively affect the devices formed on the SOI wafer surface, and they can have extremely superior device characteristics such as dielectric breakdown voltage, threshold voltage and carrier mobility with little fluctuation thereof.

The present invention also provides a method for producing an SOI wafer, which comprises mirror-polishing an SOI wafer, removing a native oxide film on the wafer surface, and subjecting the wafer to a heat treatment in an atmosphere of 100% hydrogen or a mixed gas atmosphere of argon and/or nitrogen containing 10% or more of hydrogen by using a rapid heating and rapid cooling apparatus.

If an SOI wafer is mirror-polished, a native oxide film on the wafer surface is removed, and the wafer is subjected to a hydrogen annealing heat treatment by using a rapid heating and rapid cooling apparatus as described above, an SOI wafer having surface roughness improved to 0.12 nm or less in terms of RMS value can be obtained. Therefore, if devices are fabricated on that SOI layer surface, extremely good device characteristics such as dielectric breakdown voltage, threshold voltage and carrier mobility can be obtained with little fluctuation thereof.

The present invention further provides a method for producing an SOI wafer, which comprises mirror-polishing an SOI wafer, forming a thermal oxide film having a thickness of 300 nm or more on a surface of the wafer, and removing the thermal oxide film.

Also by mirror-polishing an SOI wafer, forming a thermal oxide film having a thickness of 300 nm or more on a surface of the wafer, and removing the thermal oxide film as described above, the surface roughness of the SOI wafer can be improved, and it can be improved to 0.12 nm or less in terms of RMS value.

The present invention further provides a method for producing an SOI wafer, which comprises mirror-polishing a silicon wafer, removing a native oxide film on the wafer surface, subjecting the wafer to a heat treatment in an atmosphere of 100% hydrogen or a mixed gas atmosphere of argon and/or nitrogen containing 10% or more of hydrogen by using a rapid heating and rapid cooling apparatus to produce a bond wafer, bringing the bond wafer into close contact with a base wafer via a silicon oxide film, subjecting them to a heat treatment, and making the bond wafer into a thin film.

According to this method for producing an SOI wafer, since a silicon wafer of which surface roughness is improved by subjecting it to mirror polishing, removal of a native oxide film and hydrogen annealing heat treatment is used as the bond wafer, and the SOI wafer is produced by bonding it to a base wafer via an oxide film, the surface of the bond wafer eventually serves as the interface between the SOI layer and the buried oxide layer (SOI/BOX interface), and thus an SOI wafer having interface roughness of the interface improved to 0.12 nm or less in terms of RMS value can be obtained. Therefore, if devices are formed on this SOI wafer, extremely good device characteristics can be obtained.

In this case, the silicon oxide film can be a thermal oxide film formed on the bond wafer surface.

If a thermal oxide film is formed on the bond wafer surface and bonded to the base wafer as described above, the SOI/BOX interface can have further higher flatness because of synergism of flattening effect of the hydrogen annealing heat treatment and flattening effect of the thermal oxidation, and thus the surface roughness can surely be improved to 0.12 nm or less in terms of RMS value.

The present invention further provides a method for producing an SOI wafer, which comprises forming a first thermal oxide film on a surface of a bond wafer consisting of a mirror-polished silicon wafer, removing the first thermal oxide film, then bringing the bond wafer into close contact with a base wafer via a second oxide film, subjecting them to a heat treatment, and making the bond wafer into a thin film.

According to this method for producing an SOI wafer, since a silicon wafer of which surface roughness is improved by subjecting it to mirror polishing, formation of the first thermal oxide film and removal of the first thermal oxide film is used as a bond wafer, and the SOI wafer is produced by bonding it to a base wafer via the second oxide film, the surface of the bond wafer having improved surface roughness eventually serves as the interface between the SOI layer and the buried oxide layer (SOI/BOX interface), and thus an SOI wafer having interface roughness of the interface improved to 0.12 nm or less in terms of RMS value can be obtained. Therefore, if devices are formed on this SOI wafer, extremely good device characteristics can be obtained.

In this case, the second oxide film can be a thermal oxide film formed on the bond wafer surface.

If a thermal oxide film is formed on the bond wafer surface and bonded to the base wafer as described above, the SOI/BOX interface can have further higher flatness because of the flattening effect of the thermal oxidation, and thus the surface roughness can surely be improved to 0.12 nm or less in terms of RMS value.

The present invention further provides a method for producing an SOI wafer, which comprises removing a native oxide film on the surface of the aforementioned SOI wafer produced by making the bond wafer into a thin film, and subjecting the wafer to a heat treatment in an atmosphere of 100% hydrogen or a mixed gas atmosphere of argon and/or nitrogen containing 10% or more of hydrogen by using a rapid heating and rapid cooling apparatus.

According to this method for producing an SOI wafer, since the surface of the SOI wafer of which SOI/BOX interface has been already flattened is further flattened for surface roughness by the removal of the native oxide film and the hydrogen annealing heat treatment, the thickness uniformity of the SOI layer can further be improved by the synergism of the flattening effect for the SOI/BOX interface and the flattening effect for the surface roughness of the SOI wafer. Therefore, if devices are formed on this SOI wafer, extremely good device characteristics can be obtained.

The present invention still further provides a method for producing an SOI wafer, which comprises forming a thermal oxide film on the surface of the aforementioned SOI wafer produced by making a bond wafer into a thin film, and removing the thermal oxide film.

According to this method for producing an SOI wafer, since the surface of the SOI wafer of which SOI/BOX interface has been already flattened is further flattened for surface roughness by the formation of the thermal oxide film and the removal of the thermal oxide film, the thickness uniformity of the SOI layer can further be improved by the synergism of the flattening effect for the SOI/BOX interface and the flattening effect for the surface roughness of the SOI wafer. Therefore, if devices are formed on this SOI wafer, extremely good device characteristics with little fluctuation thereof can be obtained.

As explained in detail above, according to the present invention, an SOI wafer of high quality having surface roughness of the SOI wafer and/or the SOI/BOX interface roughness of 0.12 nm or less in terms of RMS value can easily be produced at a low cost.

Therefore, if MOS devices are fabricated by using the SOI wafer of the present invention, MOS devices of high quality can be provided with very little fluctuation in device characteristics such as oxide dielectric breakdown voltage, threshold voltage and carrier mobility.

BEST MODE FOR CARRYING OUT THE INVENTION

Hereafter, embodiments of the present invention will be explained in detail. However, the present invention is not limited to these.

The inventors of the present invention researched through experimentations aiming at improving surface roughness of SOI wafer surface and interface roughness of SOI/BOX interface, which adversely affects fluctuation in characteristics of MOS devices fabricated by using an SOI wafer, such as oxide dielectric breakdown voltage, threshold voltage and carrier mobility. As a result, they found that, as for surface roughness of SOI wafer surface, if an SOI wafer is mirror-polished, a native oxide film on the wafer surface is removed, and the wafer is subjected to a heat treatment in an atmosphere of 100% hydrogen or a mixed gas atmosphere of argon and/or nitrogen containing 10% or more of hydrogen by using an RTA apparatus, or if an SOI wafer is mirror-polished, then a thermal oxide film having a thickness of 300 nm or more is formed on the surface and the thermal oxide film is removed, the surface roughness is improved compared with ordinary mirror-polished surfaces.

Further, as for the interface roughness of SOI/BOX interface, they found that, if, among two of material wafers (mirror polished silicon wafers) for producing a bonded SOI wafer, a wafer constituting the SOI layer (bond wafer) is preliminarily subjected to either one of the aforementioned two kinds of processes and then bonded to a base wafer that serves as a support via an oxide film, and then the wafers are processed into an SOI wafer by making the bond wafer into a thin film, an SOI/BOX interface having more excellent interface roughness compared with surface roughness of ordinary mirror-polished surfaces can be obtained. Thus, they accomplished the present invention.

Hereafter, the present invention will be explained in detail by referring to the appended drawings.

Figure 1:
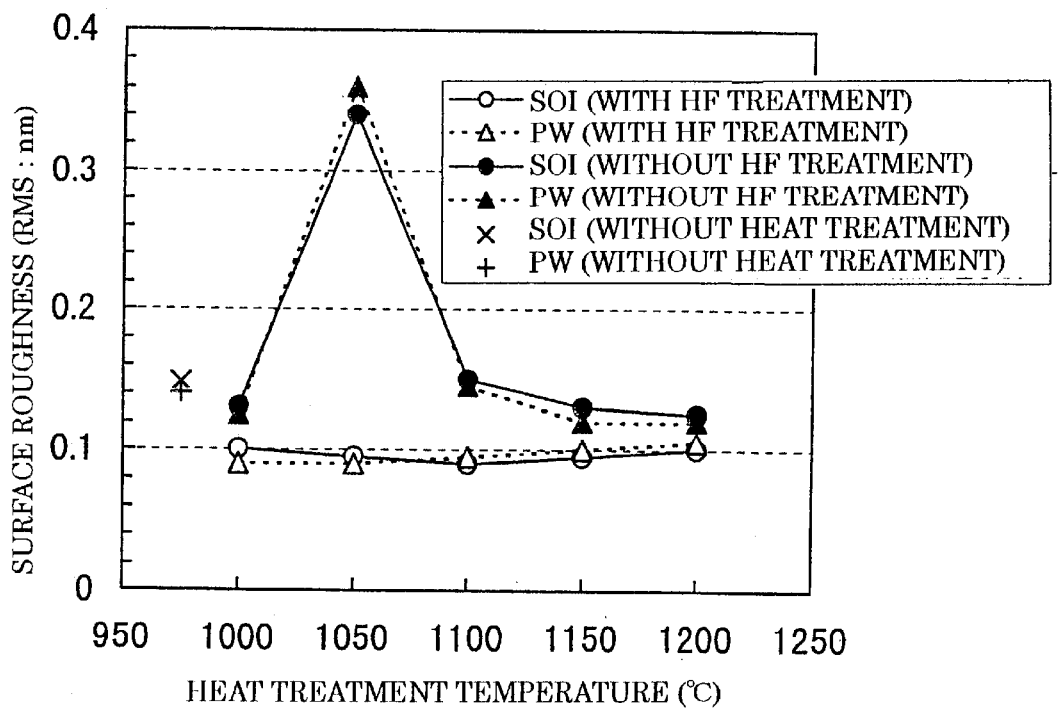
FIG. 1 shows results concerning the relationship between heat treatment temperature and surface roughness in hydrogen annealing heat treatment.

FIG. 1 shows results of surface roughness measurement of SOI wafers (of which SOI surfaces are mirror-polished surfaces) produced by the bonding method and mirror-polished silicon wafers (also abbreviated as "PW" hereinafter) after they were subjected to a heat treatment at a temperature of 1000–1200° C. for 30 seconds in an atmosphere composed of 25% by volume of hydrogen and 75% by volume of argon by using a rapid heating and rapid cooling apparatus (RTA apparatus, SHS-2800 produced by Steag Microtec International).

As these wafers, two kinds of wafers, i.e., those of which native oxide films were removed with a 1% aqueous solution of hydrofluoric acid before the RTA heat treatment and those of which native oxide films were not removed, were used.

Further, the measurement of surface roughness was performed for an area of 2 μm square by using an atomic force microscope (produced by Digital Instrument, Nanoscope-II), and represented as RMS values (square average and square root value).

From the results shown in FIG. 1, it can be seen that, if the native oxide film on the surface of wafer is removed and then the wafer is subjected to the heat treatment in an atmosphere containing hydrogen by using an RTA apparatus, the surface roughness can be improved in a degree that it should be 0.12 nm or less, or 0.10 nm or less depending on the conditions, in terms of RMS value.

In FIG. 1, × and + represent average values of surface roughness of the SOI wafer surfaces and the PW surfaces before the heat treatment, respectively.

As for the cause of this phenomenon, it is considered as follows. In general, when the heat treatment is performed in a hydrogen atmosphere at a high temperature, Si and $SiO_2$ are etched. Since the etching rate of $SiO_2$ is extremely slower than that of Si, if an uneven oxide film such as a native oxide film is present on the wafer surface, surface roughening is caused due to partially uneven etching.

Therefore, by performing the heat treatment for a wafer of which a native oxide film is completely removed, unevenness of etching can be prevented, and at the same time, the surface can be further flattened by migration of silicon atoms.

Further, since the native oxide film is removed beforehand, it is unnecessary to remove the native oxide film by applying a heat treatment at a high temperature of 1200° C. or higher, and the wafer can be heat-treated at a relatively low temperature. Therefore, it is also becomes possible to prevent generation of slip dislocations, contamination with heavy metals and the like.

Figure 2:
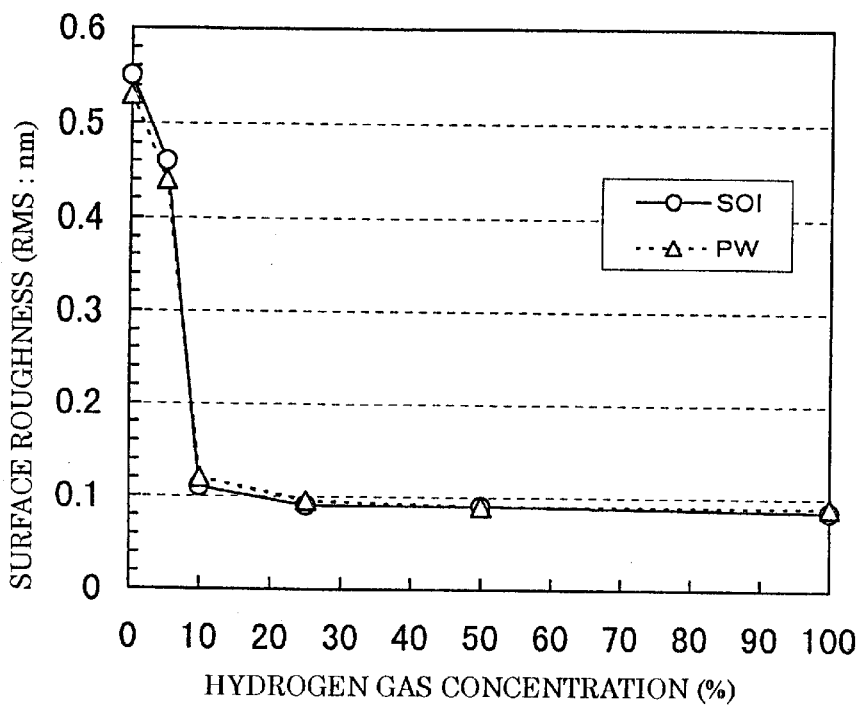
FIG. 2 shows results concerning the relationship between hydrogen gas concentration and surface roughness in hydrogen annealing heat treatment.

FIG. 2 is a graph representing the relationship of hydrogen gas concentration in the heat treatment atmosphere of an RTA apparatus and surface roughness, and it shows the relationship between the surface roughness and hydrogen gas concentration for SOI wafers and PW of which surface native oxide films were removed after they were subjected to the RTA heat treatment at 1100° C. for 30 seconds with different hydrogen gas concentrations in the mixed atmosphere of hydrogen and argon.

From the results shown in FIG. 2, it can be seen that the surface roughness was extremely degraded after the heat treatment compared with the surface roughness before the heat treatment when the hydrogen gas concentration was less than 10%, whereas it was improved when it was 10% or more.

The reason why this phenomenon was caused is considered that, if the hydrogen concentration in the heat treatment atmosphere is low, the migration of Si atoms of the wafer surface becomes unlikely to be generated, and on the other hand, surface roughening due to etching effect of the mixed gas other than hydrogen (argon, nitrogen etc.), which does not have effect for generating the migration, becomes likely to occur.

Further, it was also found that the surface could be flattened even by a heat treatment other than such RTA heat treatment in a hydrogen atmosphere as described above.

Figure 3:
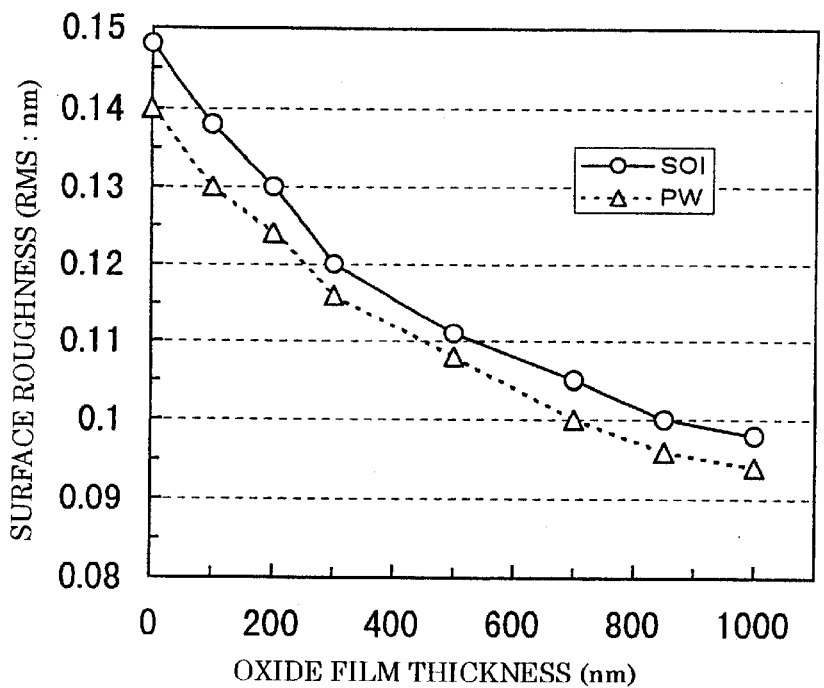
FIG. 3 shows results concerning the relationship between thermal oxide film thickness and surface roughness.

FIG. 3 shows the results of surface roughness measurement for SOI wafers and PW similar to those mentioned above, which measurement was performed in the same manner as mentioned above after thermal oxide films with different thicknesses were formed on the wafers in an atmosphere containing water vapor at 1050° C. by using an ordinary heater type heat treatment furnace and the thermal oxide films were removed with 5% aqueous solution of hydrofluoric acid.

From the results shown in FIG. 3, it can be seen that the surface roughness was more improved as a thicker oxide film was formed. In particular, it can be seen that the surface roughness was improved to about 0.12 nm or less in terms of RMS value, if an oxide film having a thickness of 300 nm or more was formed.

As for the reason why the surface roughness is improved by the formation of oxide film as described above, it is considered to be caused by the effect of interstitial silicon generated by the oxidation and injected into the wafer surface for filling surface vacancies. Therefore, it can be construed that, as the oxide film becomes thicker, more vacancies are filled, and thus the surface roughness is improved.

By the way, both of the aforementioned two kinds of heat treatments for improving the surface roughness target a surface of wafer, and they do not target the SOI/BOX interface of bonded SOI wafer. However, if an SOI wafer is produced by using PW of which surface roughness is improved by the aforementioned method as a bond wafer for a bonded SOI wafer and bonding it to a base wafer via an oxide film, the bond wafer surface of which surface roughness has been improved eventually serves as the SOI/BOX interface, and therefore an SOI wafer of which interface roughness of the interface is improved can be obtained.

In this case, if a thermal oxide film is formed on the bond wafer surface and bonded to a base wafer, the flattening effect of the heat treatment in a hydrogen atmosphere and the flattening effect of the thermal oxidation are combined, and thus the SOI/BOX interface is further flattened.

Further, the combination of the flattening effect of the heat treatment in a hydrogen atmosphere and the flattening effect of the thermal oxidation can be applied not only to the SOI/BOX interface but also to the SOI surface. That is, if a mirror-polished SOI wafer is subjected to a heat treatment in a hydrogen atmosphere to flatten its surface, and the surface is further subjected to thermal oxidation, and then removed the oxide film, the surface roughness of the SOI wafer surface can further be improved, and in addition, it becomes possible not only to improve the surface roughness but also to make the SOI layer further thinner, while maintaining the uniformity of SOI layer thickness, by repeating the thermal oxidation and the removal of oxide film as required.

Hereafter, the heat treatment apparatus used for the hydrogen annealing heat treatment of the silicon wafer and the SOI wafer of the present invention will be explained.

Examples of the rapid heating and rapid cooling apparatus (RTA apparatus) for silicon wafers used for the present invention include apparatuses such as lamp heaters for heat radiation. As an example of commercially available apparatuses, for example, Model SHS-2800, produced by Steag Microtec International, can be mentioned. These apparatuses are not particularly complicated, and are not expensive either.

As an example of the heater type heat treatment furnace, apparatuses like α-8 produced by Tokyo Electron, Ltd. can be mentioned.

Figure 5:
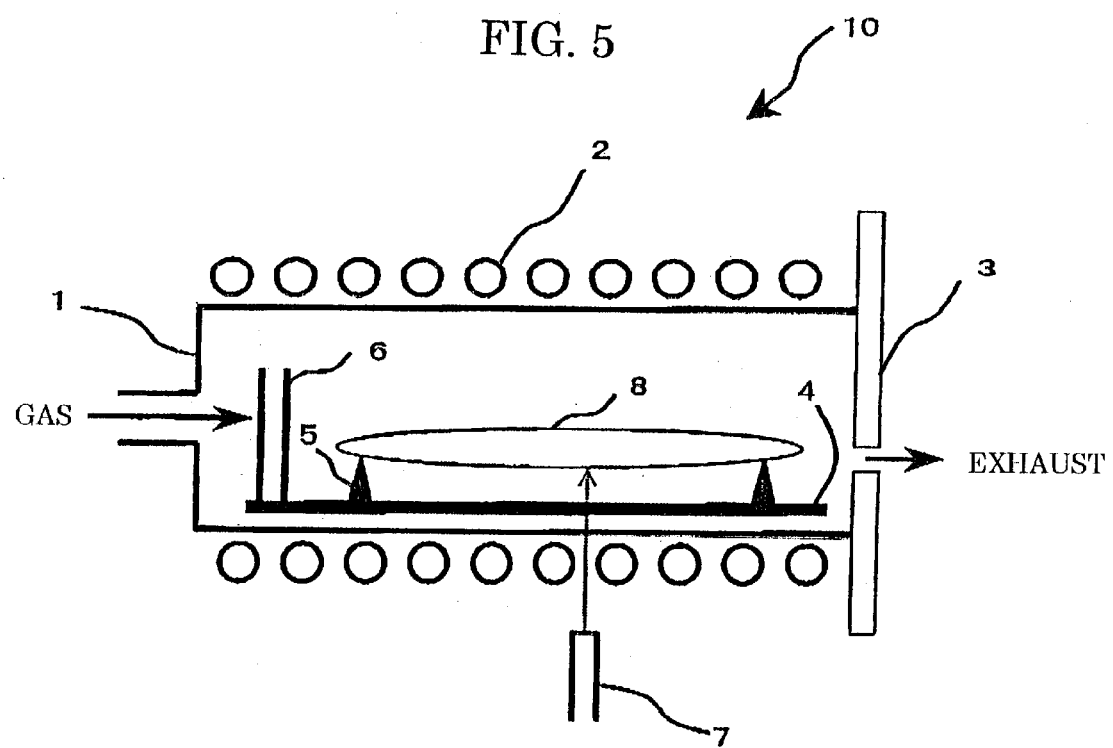
FIG. 5 is a schematic view of an exemplary rapid heating and rapid cooling apparatus used for the present invention.

FIG. 5 shows an exemplary rapid heating and rapid cooling apparatus for silicon wafers and SOI wafers used for the present invention.

The heat treatment apparatus 10 shown in FIG. 5 has a chamber 1 made of quartz, and a wafer is heat-treated within this chamber 1. Heating is achieved by heating lamps 2, which are disposed under and over the chamber and at left and right of the chamber so that they should surround the chamber 1. Electric power supplied to these lamps 2 can be independently controlled.

An automatic shutter 3 is provided at the gas exhausting side, and it shuts the outer air. The automatic shutter 3 has a wafer insertion port not shown in the figure, which can be opened and closed by a gate valve. The automatic shutter 3 is also provided with a gas exhausting outlet, so that the atmosphere in the furnace can be controlled.

The wafer 8 is placed on a three-point supporting part 5 formed on a quartz tray 4. A buffer 6 made of quartz is provided at the gas inlet side of the tray 4, so that it can prevent the wafer 8 from being directly blown by the introduced gas flow.

Further, the chamber 1 is provided with a special window for temperature measurement, which is not shown in the figure, and the temperature of the wafer 8 can be measured by a pyrometer 7 installed in the outside of the chamber 1 through the special window.

By using the heat treatment apparatus 10 mentioned above, the heat treatment for rapid heating and rapid cooling of the silicon wafer 8 is performed as follows.

First, the wafer 8 is loaded into the chamber 1 from the insertion port and placed on the tray 4 by a wafer handling apparatus, which is installed at a position adjacent to the heat treatment apparatus 10 but not shown in the figure. Then, the automatic shutter 3 is closed.

The inside of the chamber 1 is sufficiently purged with nitrogen gas, and then the atmospheric gas is changed to 100% hydrogen or a mixed gas of hydrogen and Ar or nitrogen. Subsequently, electric power is supplied to the heating lamps 2 to heat the wafer 8 to a predetermined temperature, for example, 1000° C. to 1300° C. In this operation, it takes, for example, about 20 seconds to attain the desired temperature. Then, the wafer 8 is maintained at the temperature for a predetermined period of time, and thus the wafer 8 can be subjected to a high temperature heat treatment. When the predetermined time has passed and the high temperature heat treatment was finished, output of the lamps is reduced to lower the temperature of the wafer. This temperature decrease can also be attained during a period of, for example, about 20 seconds. Finally, the wafer is unloaded by the wafer handling apparatus to finish the hydrogen annealing heat treatment.

When other wafers are further subjected to the heat treatment, the wafers can be successively loaded to continuously perform the RTA treatment. When the thermal oxidation treatment is performed by using an RTA apparatus, the treatment temperature, treatment gas atmosphere etc. can be changed.

The present invention will be explained hereafter with reference to the following example of the present invention and comparative example. However, the present invention is not limited to these.

EXAMPLE AND COMPARATIVE EXAMPLE

Figure 4:
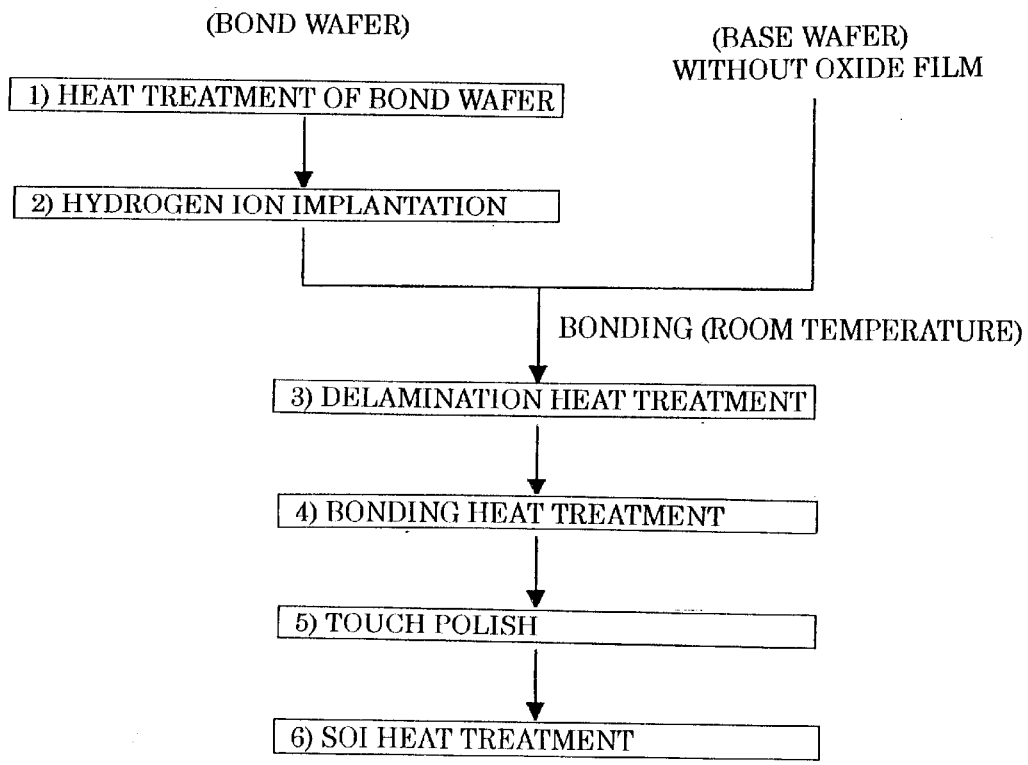
FIG. 4 is a flow chart representing an exemplary production process of the SOI wafer of the present invention.

Silicon wafers (PW) having a diameter of 200 mm, each of which one side was mirror-polished, were prepared as bond wafers and base wafers in a number of six for each, and 6 bonded SOI wafers were produced by using these 12 wafers according to the production process shown in FIG. 4.

The detailed production conditions of each step of the flow chart shown in FIG. 4 are as follows.

[1] Heat Treatment Step for Bond Wafer

Bond wafers of which native oxide films were removed with 1% aqueous solution of hydrofluoric acid were subjected to either one of the following steps of (a) and (b).

(a) Heat treatment was performed at 1100° C. for 30 seconds in an atmosphere containing 25% by volume of hydrogen and 75% by volume of argon by using an RTA apparatus (SHS-2800).

(b) Heat treatment was performed at 1050° C. in an atmosphere containing water vapor in a heater type heat treatment furnace to form a thermal oxide film having a thickness of about 300 nm, and then the thermal oxide film was removed with 5% aqueous solution of HF.

[2] Hydrogen ion implantation Step

Oxide film thickness (buried oxide film thickness) before implantation of hydrogen ions: a thermal oxide film having a thickness of 100 nm was formed.

Hydrogen Ion Implantation condition (formation of delamination layer): $H^+$ ions, 45 keV, $8\times10_{16}$ atoms/cm$^2$.

[3] Delamination Heat Treatment Step

Heat treatment was performed at 500° C. for 30 minutes in a nitrogen atmosphere.

[4] Bonding Heat Treatment Step

Heat treatment was performed at 1100° C. for 120 minutes in a nitrogen atmosphere.

[5] Touch Polish Step

Stock removal for polishing: about 10 nm

By this operation, an SOI wafer was obtained in which an SOI layer had a film thickness of 280 nm and fluctuation thereof in plane of ±5 nm.

[6] Heat Treatment Step for SOI Layer (a) Heat treatment was performed at 1100° C. for 30 seconds in an atmosphere containing 25% by volume of hydrogen and 75% by volume of argon by using an RTA apparatus (SHS-2800).

(b) Heat treatment was performed at 1050° C. in an atmosphere containing water vapor in a heater type heat treatment furnace to form a thermal oxide film having a thickness of about 300 nm, and then the thermal oxide film was removed with 5% aqueous solution of HF.

According to the production process of SOI wafers shown in FIG. 4, 6 sets of SOI wafers were prepared with different production conditions (Examples 1–5, Comparative Example 1) by using combinations of the bond wafer heat treatment and the SOI heat treatment shown in Table 1. Surface roughness of SOI layer and SOI/BOX interface roughness of these SOI wafers (RMS value for 2 μm square) were measured by AFM (atomic force microscope), and the results are shown in Table 1.

As for the measurement of the SOI/BOX interface roughness, the SOI layer was removed by etching with TMAH (tetramethylammonium hydride) solution and surface roughness of the exposed BOX surface was measured and evaluated.

TABLE 1

| | Example No. | | | | | |
| --- | --- | --- | --- | --- | --- | --- |
| | Example | | | | | Comparative |
| Item | 1 | 2 | 3 | 4 | 5 | Example 1 |
| Bond wafer heat treatment | None | (a) | (a) | (b) | (b) | None |
| SOI heat treatment | (a) | (a) | (b) | (a) | (b) | None |
| SOI/BOX interface roughness (nm) | 0.133 | 0.095 | 0.097 | 0.115 | 0.113 | 0.135 |
| SOI surface roughness (nm) | 0.097 | 0.101 | 0.120 | 0.105 | 0.118 | 0.145 |

[Note]
(a) Heat treatment was performed at 1100° C. for 30 seconds in an atmosphere containing 25% by volume of hydrogen and 75% by volume of argon by using RTA apparatus (SHS-2800).
(b) Heat treatment was performed at 1050° C. in an atmosphere containing water vapor in a heater type heat treatment furnace to form a thermal oxide film having a thickness of about 300 nm, and then the thermal oxide film was removed with 5% aqueous solution of HF.

(a) Heat treatment was performed at 1100° C. for 30 seconds in an atmosphere containing 25% by volume of hydrogen and 75% by volume of argon by using an RTA apparatus (SHS-2800).

(b) Heat treatment was performed at 1050° C. in an atmosphere containing water vapor in a heater type heat treatment furnace to form a thermal oxide film having a thickness of about 300 nm, and then the thermal oxide film was removed with 5% aqueous solution of HF.

From the results of the SOI layer surface roughness and the SOI/BOX interface roughness shown in Table 1, it can be seen that SOI wafers having the SOI layer surface roughness and/or the SOI/BOX interface roughness of 0.12 nm or less in terms of RMS value can be obtained according to the present invention.

That is, there can be provided, as SOI wafers for MOS devices, SOI wafers that can markedly reduce fluctuation of MOS device characteristics such as oxide dielectric breakdown voltage, threshold voltage and carrier mobility, and methods for producing them.

The present invention is not limited to the embodiments described above. The above-described embodiments are mere examples, and those having the substantially same structure as that described in the appended claims and providing the similar functions and advantages are included in the scope of the present invention.

For example, in the aforementioned embodiments of the present invention, SOI wafers were prepared from a silicon single crystal having a diameter of 200 mm (8 inches). However, the present invention can satisfactorily be used for those of a recently used larger diameter of 250 mm (10 inches) to 400 mm (16 inches) or more.

Further, while only a case where the RTA heat treatment or the formation and removal of oxide film were performed for bond wafers was exemplified, they may be performed for base wafers.

What is claimed is:

1. An SOI wafer wherein the SOI wafer comprises a buried oxide layer having insulating properties and an SOI layer serving as an active silicon layer on a base wafer, and surface roughness of an SOI layer surface serving as an active silicon layer of the SOI wafer is 0.12 nm or less in terms of RMS value.

2. An SOI wafer wherein the SOI wafer comprises a buried oxide layer having insulating properties and an SOI layer serving as an active silicon layer on a base wafer, and interface roughness of an interface between the SOI layer serving as an active silicon layer and the buried oxide layer having insulating properties of the SOI wafer is 0.12 nm or less in terms of RMS value.

3. An SOI wafer wherein the SOI wafer comprises a buried oxide layer having insulating properties and an SOI layer serving as an active silicon layer on a base wafer, and surface roughness of an SOI layer surface serving as an active silicon layer of the SOI wafer is 0.12 nm or less in terms of RMS value, and interface roughness of an interface between the SOI layer and the buried oxide layer having insulating properties of the SOI wafer is 0.12 nm or less in terms of RMS value.

4. A method for producing an SOI wafer, which comprises mirror-polishing an SOI wafer, removing a native oxide film on a surface of the wafer, and subjecting the wafer to a heat treatment in an atmosphere of 100% hydrogen or a mixed gas atmosphere of argon and/or nitrogen containing 10% or more of hydrogen by using a rapid heating and rapid cooling apparatus.

5. A method for producing an SOI wafer, which comprises mirror-polishing an SOI wafer that comprises a buried oxide layer having insulating properties and an SOI layer serving as an active silicon layer on a base wafer, forming a thermal oxide film having a thickness of 300 nm or more on a surface of the wafer, and removing the thermal oxide film.

6. A method for producing an SOI wafer, which comprises mirror-polishing a silicon wafer, removing a native oxide film on a surface of the wafer, subjecting the wafer to a heat treatment in an atmosphere of 100% hydrogen or a mixed gas atmosphere of argon and/or nitrogen containing 10% or more of hydrogen by using a rapid heating and rapid cooling apparatus to produce a bond wafer, bringing the bond wafer into close contact with a base wafer via a silicon oxide film, subjecting them to a heat treatment, and making the bond wafer into a thin film.

7. The method for producing an SOI wafer according to claim 6, wherein the silicon oxide film is a thermal oxide film formed on the bond wafer surface.

8. The method for producing an SOI wafer according to claim 7, which comprises removing a native oxide film on the surface of the SOI wafer produced by making the bond wafer into a thin film, and subjecting the wafer to a heat treatment in an atmosphere of 100% hydrogen or a mixed gas atmosphere of argon and/or nitrogen containing 10% or more of hydrogen by using a rapid heating and rapid cooling apparatus.

9. The method for producing an SOI wafer according to claim 7, which comprises forming a thermal oxide film on the surface of the SOI wafer produced by making a bond wafer into a thin film, and removing the thermal oxide film.

10. The method for producing an SOI wafer according to claim 6, which comprises removing a native oxide film on the surface of the SOI wafer produced by making the bond wafer into a thin film, and subjecting the wafer to a heat treatment in an atmosphere of 100% hydrogen or a mixed gas atmosphere of argon and/or nitrogen containing 10% or more of hydrogen by using a rapid heating and rapid cooling apparatus.

11. The method for producing an SOI wafer according to claim 6, which comprises forming a thermal oxide film on the surface of the SOI wafer produced by making a bond wafer into a thin film, and removing the thermal oxide film.

12. A method for producing an SOI wafer, which comprises forming a first thermal oxide film on a surface of a bond wafer consisting of a mirror polished silicon wafer, removing the first thermal oxide film, then bringing the bond wafer into close contact with a base wafer via a second oxide film, subjecting them to a heat treatment, and making the bond wafer into a thin film.

13. The method for producing an SOI wafer according to claim 12, wherein the second oxide film is a thermal oxide film formed on the bond wafer surface.

14. The method for producing an SOI wafer according to claim 13, which comprises removing a native oxide film on the surface of the SOI wafer produced by making the bond wafer into a thin film, and subjecting the wafer to a heat treatment in an atmosphere of 100% hydrogen or a mixed gas atmosphere of argon and/or nitrogen containing 10% or more of hydrogen by using a rapid heating and rapid cooling apparatus.

15. The method for producing an SOI wafer according to claim 13, which comprises forming a thermal oxide film on the surface of the SOI wafer produced by making a bond wafer into a thin film, and removing the thermal oxide film.

16. The method for producing an SOI wafer according to claim 12, which comprises removing a native oxide film on the surface of the SOI wafer produced by making the bond wafer into a thin film, and then subjecting the wafer to a heat treatment in an atmosphere of 100% hydrogen or a mixed gas atmosphere of argon and/or nitrogen containing 10% or more of hydrogen by using a rapid heating and rapid cooling apparatus.

17. The method for producing an SOI wafer according to claim 12, which comprises forming a thermal oxide film on the surface of the SOI wafer produced by making a bond wafer into a thin film, and removing the thermal oxide film.

* * * * *